(12) United States Patent
Du et al.

(10) Patent No.: US 10,950,196 B2
(45) Date of Patent: Mar. 16, 2021

(54) SHIFT REGISTER, METHOD FOR DRIVING THE SAME, GATE DRIVING CIRCUIT, AND DISPLAY DEVICE

(71) Applicants: BOE Technology Group Co., Ltd., Beijing (CN); HEFEI XINSHENG OPTOELECTRONICS TECHNOLOGY CO., LTD., Anhui (CN)

(72) Inventors: Ruifang Du, Beijing (CN); Zijun Cao, Beijing (CN); Xiaoye Ma, Beijing (CN); Rui Ma, Beijing (CN)

(73) Assignees: BOE TECHNOLOGY GROUP CO., LTD., Beijing (CN); HEFEI XINSHENG OPTOELECTRONICS TECHNOLOGY CO., LTD., Anhui (CN)

( * ) Notice: Subject to any disclaimer, the term of this patent is extended or adjusted under 35 U.S.C. 154(b) by 354 days.

(21) Appl. No.: 16/077,369

(22) PCT Filed: Feb. 12, 2018

(86) PCT No.: PCT/CN2018/076384
§ 371 (c)(1),
(2) Date: Aug. 10, 2018

(87) PCT Pub. No.: WO2018/233306
PCT Pub. Date: Dec. 27, 2018

(65) Prior Publication Data
US 2020/0357352 A1    Nov. 12, 2020

(30) Foreign Application Priority Data
Jun. 21, 2017 (CN) .......................... 201710478926.5

(51) Int. Cl.
*G09G 3/36* (2006.01)
*G11C 19/28* (2006.01)

(52) U.S. Cl.
CPC ......... *G09G 3/3677* (2013.01); *G09G 3/3696* (2013.01); *G11C 19/28* (2013.01);
(Continued)

(58) Field of Classification Search
CPC .............. G09G 3/3677; G09G 3/3696; G09G 2300/0809; G09G 2310/0286; G11C 19/28
See application file for complete search history.

(56) References Cited

U.S. PATENT DOCUMENTS

2014/0086379 A1* 3/2014 Ma .......................... H03K 5/00
377/64
2015/0356934 A1   12/2015 Yamashita et al.
(Continued)

FOREIGN PATENT DOCUMENTS

CN    102654986    9/2012
CN    202434192    9/2012
(Continued)

OTHER PUBLICATIONS

Written Opinion of the International Searching Authority with English language translation corresponding to PCT/CN2018/076384 dated May 9, 2018. (8 pages).
(Continued)

*Primary Examiner* — Amare Mengistu
*Assistant Examiner* — Jennifer L Zubajlo
(74) *Attorney, Agent, or Firm* — Myers Bigel, P.A.

(57) ABSTRACT

A shift register, a method for driving the same, a gate driving circuit, and a display device are described. The shift register includes a pull-up control circuit which outputs the voltage of a signal input terminal, a pull-up circuit which outputs the
(Continued)

voltage of a first clock signal input terminal, a pull-down control circuit which outputs the voltage of a second clock signal input terminal, or pulls down the voltage of the pull-down node, a pull-down circuit which pulls down voltages of the pull-up node and the signal output terminal to the first voltage terminal, respectively, a reset circuit which pulls down voltages of the pull-up node and the signal output terminal to the first voltage terminal, respectively, and a noise reduction control circuit which outputs the voltage of a noise reduction control signal terminal to the pull-down node in the blanking time of an image frame.

16 Claims, 4 Drawing Sheets

(52) U.S. Cl.
CPC ............... *G09G 2300/0809* (2013.01); *G09G 2310/0286* (2013.01)

(56) References Cited

U.S. PATENT DOCUMENTS

2017/0221441 A1* 8/2017 Gu ..................... G09G 3/3677
2018/0082652 A1* 3/2018 Lv ........................ G09G 3/36
2018/0261178 A1* 9/2018 Shao .................... G09G 3/3677
2018/0293925 A1* 10/2018 Dong .................... G11C 19/28
2018/0335814 A1 11/2018 Shao et al.

FOREIGN PATENT DOCUMENTS

| CN | 202487125 | | 10/2012 | |
| CN | 106057147 | | 10/2016 | |
| CN | 106847218 | | 6/2017 | |
| CN | 106847218 A | * | 6/2017 | ........... G09G 3/3677 |
| CN | 107039017 | | 8/2017 | |

OTHER PUBLICATIONS

International Search Report of the International Searching Authority with English language translation corresponding to PCT/CN2018/076384 dated May 9, 2018. (8 pages).

First Chinese Office Action with English language translation corresponding to Chinese Application No. 201710478926.5 dated Jun. 5, 2018. (13 pages).

Second Chinese Office Action with English language translation corresponding to Chinese Application No. 201710478926.5 dated Oct. 31, 2018. (15 pages).

* cited by examiner

US 10,950,196 B2

SHIFT REGISTER, METHOD FOR DRIVING THE SAME, GATE DRIVING CIRCUIT, AND DISPLAY DEVICE

CROSS REFERENCE TO RELATED APPLICATIONS

The present application is a 35 U.S.C. 371 national stage application of PCT International Application No. PCT/CN2018/076384, filed on Feb. 12, 2018, which claims the benefit of Chinese patent application No. 201710478926.5, filed on Jun. 21, 2017, the contents of which are incorporated herein by reference in their entireties.

TECHNICAL FIELD

The disclosure relates to the field of display technology, and in particular, to a shift register, a method for driving the same, a gate driving circuit, and a display device.

BACKGROUND

Liquid crystal displays (LCDs for short) have the advantages of low radiation, small volumes and low energy consumption, etc., and have been widely applied in electronic products such as notebooks, flat-screen televisions or mobile phones, etc.

In the reference, a GOA (Gate Driver on Array) circuit is usually arranged in the peripheral of the array substrate in a liquid crystal display for progressive scanning of gate lines. Exemplarily, in an image frame, the GOA circuit will scan the gate lines row by row from top to bottom or from bottom to top. Taking scanning the gate lines from top to bottom as an example, after the last row of gate lines is scanned, the GOA circuit needs to return back to the first row from the last row and proceeds at a step of scanning a next image frame. To avoid affection of the display, in the period of time of returning back to the first row from the last row, it is required that any shift register in the GOA circuit does not have a signal output, and the period of time is a blanking time.

However, in the blanking time, charges stored in part of the nodes or transistors of the GOA circuit do not get fully released due to the structure of the GOA circuit and the coupling capacitors of its internal transistors themselves. As such, in the blanking time, noise interference will be caused to the output terminal of a shift register in the GOA circuit, and the stability of the GOA circuit will be reduced.

SUMMARY

Embodiments of the disclosure provide a shift register, a method for driving the same, a gate driving circuit, and a display device.

The embodiments of the disclosure employ the following technical solutions.

In an aspect of the embodiments of the disclosure, there is provided a shift register including a pull-up control circuit, a pull-up circuit, a pull-down control circuit, a pull-down circuit, a reset circuit and a noise reduction control circuit, the pull-up control circuit is connected with a signal input terminal and a pull-up node, and used for outputting the voltage of the signal input terminal to the pull-up node under the control of the signal input terminal, the pull-up circuit is connected with the pull-up node, a first clock signal input terminal and a signal output terminal, and used for storing the potential of the pull-up node and outputting the voltage of the first clock signal input terminal to the signal output terminal under the control of the pull-up node, the pull-down control circuit is connected with a second clock signal input terminal, the pull-up node, a pull-down node and a first voltage terminal, and used for outputting the voltage of the second clock signal input terminal to the pull-down node under the control of the second clock signal input terminal, or used for pulling down the voltage of the pull-down node to the voltage of the first voltage terminal under the control of the pull-up node, the pull-down circuit is connected with the pull-down node, the pull-up node, the signal output terminal and the first voltage terminal, and used for pulling down the voltages of the pull-up node and the signal output terminal to the voltage of the first voltage terminal, respectively, under the control of the pull-down node, the reset circuit is connected with a reset signal terminal, the pull-up node, the signal output terminal and the first voltage terminal, and used for pulling down the voltages of the pull-up node and the signal output terminal to the voltage of the first voltage terminal, respectively, under the control of the reset signal terminal, and the noise reduction control circuit is connected with a noise reduction control signal terminal and the pull-down node, and used for outputting the voltage of the noise reduction control signal terminal to the pull-down node under the control of the noise reduction control signal terminal in the blanking time of an image frame.

Exemplarily, the noise reduction control circuit is constituted by a first transistor, and the gate and a first pole of the first transistor are connected with the noise reduction control signal terminal, and a second pole thereof is connected with the pull-down node.

Exemplarily, the pull-up control circuit includes a second transistor, and the gate and a first pole of the second transistor are connected with the signal input terminal, and a second pole thereof is connected with the pull-up node.

Exemplarily, the pull-up circuit includes a driving transistor and a storage capacitor, the gate of the driving transistor is connected with the pull-up node, a first pole thereof is connected with the first clock signal input terminal, and a second pole thereof is connected with the signal output terminal, and one end of the storage capacitor is connected with the pull-up node, and the other end is connected with the signal output terminal.

Exemplarily, the pull-down control circuit includes a third transistor, a fourth transistor, a fifth transistor and a sixth transistor, the gate and a first pole of the third transistor are connected with the second clock signal input terminal, and a second pole thereof is connected with the gate of the fourth transistor, a first pole of the fourth transistor is connected with the second clock signal input terminal, and a second pole thereof is connected with the pull-down node, the gate of the fifth transistor is connected with the pull-up node, a first pole thereof is connected with the second pole of the third transistor, and a second pole thereof is connected with the first voltage terminal, and the gate of the sixth transistor is connected with the pull-up node, a first pole thereof is connected with the pull-down node, and a second pole thereof is connected with the first voltage terminal.

Exemplarily, the pull-down circuit includes a seventh transistor and an eighth transistor, the gate of the seventh transistor is connected with the pull-down node, a first pole thereof is connected with the pull-up node, and a second pole thereof is connected with the first voltage terminal, and the gate of the eighth transistor is connected with the pull-down node, a first pole thereof is connected with the signal output terminal, and a second pole thereof is connected with the first voltage terminal.

Exemplarily, the reset circuit includes a ninth transistor and a tenth transistor, the gate of the ninth transistor is connected with the reset signal terminal, a first pole thereof is connected with the pull-up node, and a second pole thereof is connected with the first voltage terminal, and the gate of the tenth transistor is connected with the reset signal terminal, a first pole thereof is connected with the signal output terminal, and a second pole thereof is connected with the first voltage terminal.

Exemplarily, there is further included an auxiliary noise reduction module which is connected with the second clock signal input terminal, the signal output terminal and the first voltage terminal, and used for pulling down the voltage of the signal output terminal to the voltage of the first voltage terminal under the control of the second clock signal input terminal.

Further exemplarily, the auxiliary noise reduction module includes an eleventh transistor, and the gate of the eleventh transistor is connected with the second clock signal input terminal, a first pole thereof is connected with the signal output terminal, and a second pole thereof is connected with the first voltage terminal.

Further exemplarily, the pull-up control circuit is further connected with the second clock signal input terminal, and used for outputting the voltage of the signal input terminal to the pull-up node under the control of the second clock signal input terminal, the pull-up control circuit further includes a twelfth transistor, and the gate of the twelfth transistor is connected with the second clock signal input terminal, a first pole thereof is connected with the signal input terminal, and a second pole thereof is connected with the pull-up node.

In another aspect of the embodiments of the disclosure, there is provided a gate driving circuit including multiple cascaded shift registers of any of the kinds as described above, the signal input terminal of the shift register at a first stage is connected with a starting signal terminal, apart from the shift register at the first stage, the signal output terminal of the shift register at a previous stage is connected with the signal input terminal of the shift register at a next stage, apart from the shift register at a last stage, the signal output terminal of the shift register at a next stage is connected with the reset signal terminal of the shift register at a previous stage, and the reset signal terminal of the shift register at the last stage is connected with the starting signal terminal.

In still another aspect of the embodiments of the disclosure, there is provided a display device including a gate driving circuit as described above.

In yet still another aspect of the embodiments of the disclosure, there is provided a method for driving a shift register of any of the kinds as described above, and in an image frame, the method includes: at an input phase, the pull-up control circuit outputting the voltage of the signal input terminal to the pull-up node under the control of the signal input terminal, the pull-up circuit storing the potential of the pull-up node and outputting the voltage of the first clock signal input terminal to the signal output terminal under the control of the pull-up node, and the pull-down control circuit pulling down the voltage of the pull-down node to the voltage of the first voltage terminal under the control of the pull-up node, at an output phase, the pull-up circuit outputting the signal stored at the previous phase to the pull-up node, the pull-up circuit outputting the voltage of the first clock signal input terminal to the signal output terminal under the control of the pull-up node, the signal output terminal outputting a gate scanning signal, and the pull-down control circuit pulling down the voltage of the pull-down node to the voltage of the first voltage terminal under the control of the pull-up node, at a reset phase, the reset circuit pulling down the voltages of the pull-up node and the signal output terminal to the voltage of the first voltage terminal, respectively, under the control of the reset signal terminal, the pull-down control circuit outputting the voltage of the second clock signal input terminal to the pull-down node under the control of the second clock signal input terminal, and the pull-down circuit pulling down the voltages of the pull-up node and the signal output terminal to the voltage of the first voltage terminal, respectively, under the control of the pull-down node, and in the blanking time, the noise reduction control circuit outputting the voltage of the noise reduction control signal terminal to the pull-down node under the control of the noise reduction control signal terminal, and the pull-down circuit pulling down the voltages of the pull-up node and the signal output terminal to the voltage of the first voltage terminal, respectively, under the control of the pull-down node.

Exemplarily, in a case in which the shift register includes the auxiliary noise reduction module, in an image frame, the method further includes: at the input phase and the reset phase, the auxiliary noise reduction module pulling down the voltage of the signal output terminal to the voltage of the first voltage terminal under the control of the second clock signal input terminal.

BRIEF DESCRIPTION OF THE DRAWINGS

In order to more clearly illustrate the technical solutions in embodiments of the disclosure or the reference, the appended drawings needing to be used in the description of the embodiments or the reference will be introduced briefly in the following. The drawings in the following description are only some embodiments of the disclosure, and for the person having ordinary skills in the art, other drawings may also be obtained according to these drawings under the premise of not paying out undue experimentation.

REFERENCE SIGNS

Figure 1:
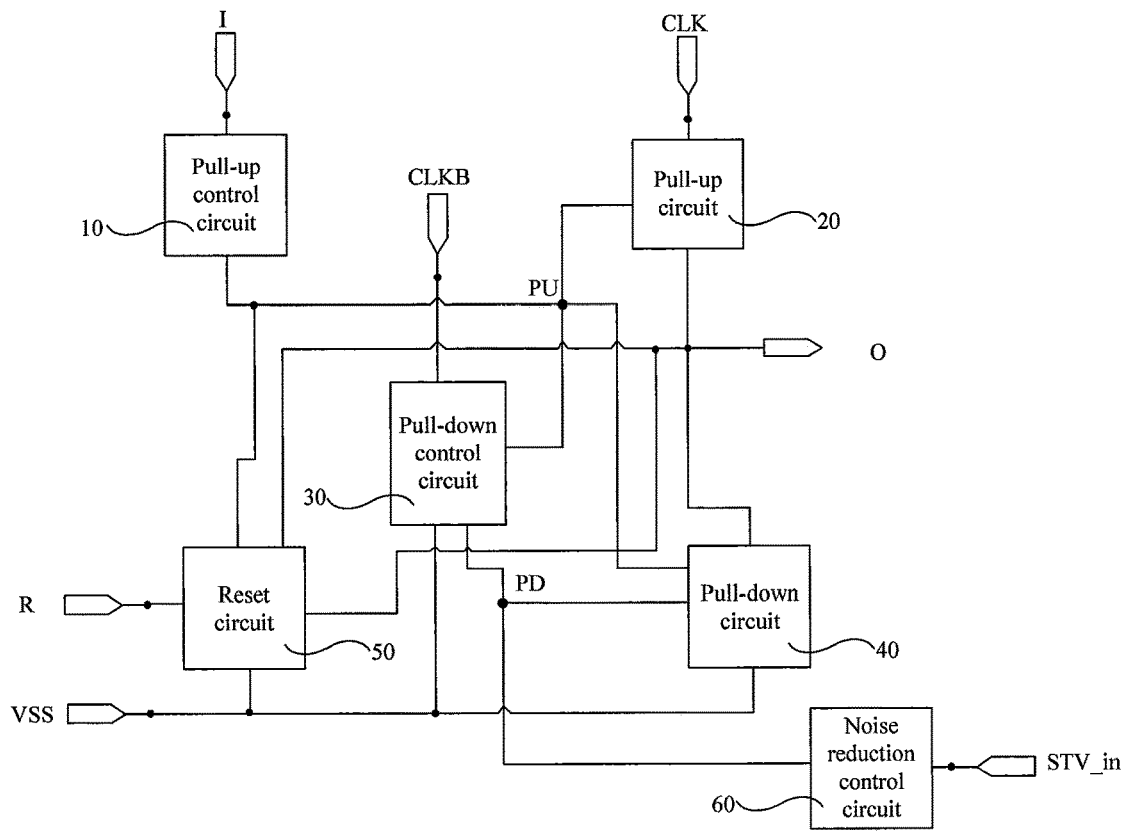
FIG. 1 is a structure diagram of a shift register provided by an embodiment of the disclosure.

10 Pull-up control circuit
20 Pull-up circuit
30 Pull-down control circuit
40 Pull-down circuit
50 Reset circuit
60 Noise reduction control circuit
70 Auxiliary noise reduction module
I Signal input terminal
CLK First clock signal input terminal
CLKB Second clock signal input terminal
O Signal output terminal
R Reset signal terminal
VSS First voltage terminal
STV_in Noise reduction control signal terminal.

DETAILED DESCRIPTION

In the following the technical solutions in embodiments of the disclosure will be described clearly and completely in conjunction with the drawings in the embodiments of the disclosure. Obviously, the described embodiments are just a part of the embodiments of the disclosure, and not all the embodiments. Based on the embodiments in the disclosure, all the other embodiments obtained by the person having ordinary skills in the art under the premise of not paying out undue experimentation pertain to the scope protected by the disclosure.

An embodiment of the disclosure provides a shift register including a pull-up control circuit 10, a pull-up circuit 20, a pull-down control circuit 30, a pull-down circuit 40, a reset circuit 50 and a noise reduction control circuit 60, as shown in FIG. 1.

Exemplarily, the pull-up control circuit 10 is connected with a signal input terminal I and a pull-up node PU. The pull-up control circuit 10 is used for outputting the voltage of the signal input terminal I to the pull-up node PU under the control of the signal input terminal I.

The pull-up circuit 20 is connected with the pull-up node PU, a first clock signal input terminal CLK and a signal output terminal O. The pull-up circuit 20 is used for storing the potential of the pull-up node PU and outputting the voltage of the first clock signal input terminal CLK to the signal output terminal O under the control of the pull-up node PU.

The pull-down control circuit 30 is connected with a second clock signal input terminal CLKB, the pull-up node PU, a pull-down node PD and a first voltage terminal VSS. The pull-down control circuit 30 is used for outputting the voltage of the second clock signal input terminal CLKB to the pull-down node PD under the control of the second clock signal input terminal CLKB. The pull-down control circuit 30 is used for pulling down the voltage of the pull-down node PD to the voltage of the first voltage terminal VSS under the control of the pull-up node PU.

The pull-down circuit 40 is connected with the pull-down node PD, the pull-up node PU, the signal output terminal O and the first voltage terminal VSS. The pull-down circuit 40 is used for pulling down the voltages of the pull-up node PU and the signal output terminal O to the voltage of the first voltage terminal VSS, respectively, under the control of the pull-down node PD.

The reset circuit 50 is connected with a reset signal terminal R, the pull-up node PU, the signal output terminal O and the first voltage terminal VSS. The reset circuit 50 is used for pulling down the voltages of the pull-up node PU and the signal output terminal O to the voltage of the first voltage terminal VSS, respectively, under the control of the reset signal terminal R.

The noise reduction control circuit 60 is connected with a noise reduction control signal terminal STV_in and the pull-down node PD. The noise reduction control circuit 60 is used for outputting the voltage of the noise reduction control signal terminal STV_in to the pull-down node PD under the control of the noise reduction control signal terminal STV_in in the blanking time of an image frame, such that the pull-down circuit 40 pulls down the voltages of the pull-up node PU and the signal output terminal O to the voltage of the first voltage terminal VSS, respectively, under the control of the pull-down node PD.

From the above, in an image frame, the potential of the pull-up node PU may be controlled by the pull-up control circuit 10. Based on this, the pull-up circuit 20 may output the voltage of the first clock signal input terminal CLK to the signal output terminal O under the control of the pull-up node PU, such that the signal output terminal O can output a gate scanning signal to a gate line connected with the signal output terminal O at the output phase of the shift register. In addition, the pull-down control circuit 30 can control the potential of the pull-down node PD, such that the pull-down circuit 40 may pull down the potentials of the pull-up node PU and the signal output terminal O to the voltage of the first voltage terminal VSS under the control of the pull-down node PD, and thereby it may be possible to ensure that there is no signal output at the signal output terminal O of the shift register at a non-output phase of the shift register. On this basis, under the control of the reset signal terminal R, the reset circuit 50 may further pull down the potentials of the pull-up node PU and the signal output terminal O to the voltage of the first voltage terminal VSS, and thereby reset the potentials of the pull-up node PU and the signal output terminal O, to avoid that the residual charges on the pull-up node PU and the signal output terminal O affect the display screen of a next image frame.

In addition, in the blanking time of an image frame, to avoid that the charges stored by the pull-up node PD and a transistor(s) do not get fully released, the voltage of the noise reduction control signal terminal STV_in may be outputted to the pull-down node PD by the noise reduction control circuit 60, to control the potential of the pull-down node PD, such that under the control of the pull-down node PD, the pull-down circuit 40 can pull down the voltages of the pull-up node PU and the signal output terminal O to the voltage of the first voltage terminal VSS, respectively, thereby releasing the charges stored by the pull-up node PU and the signal output terminal O and achieving the purpose of noise reduction processing.

In the following, a detailed illustration will be given for the structures of the various modules in the shift register as shown in FIG. 1.

Figure 2:
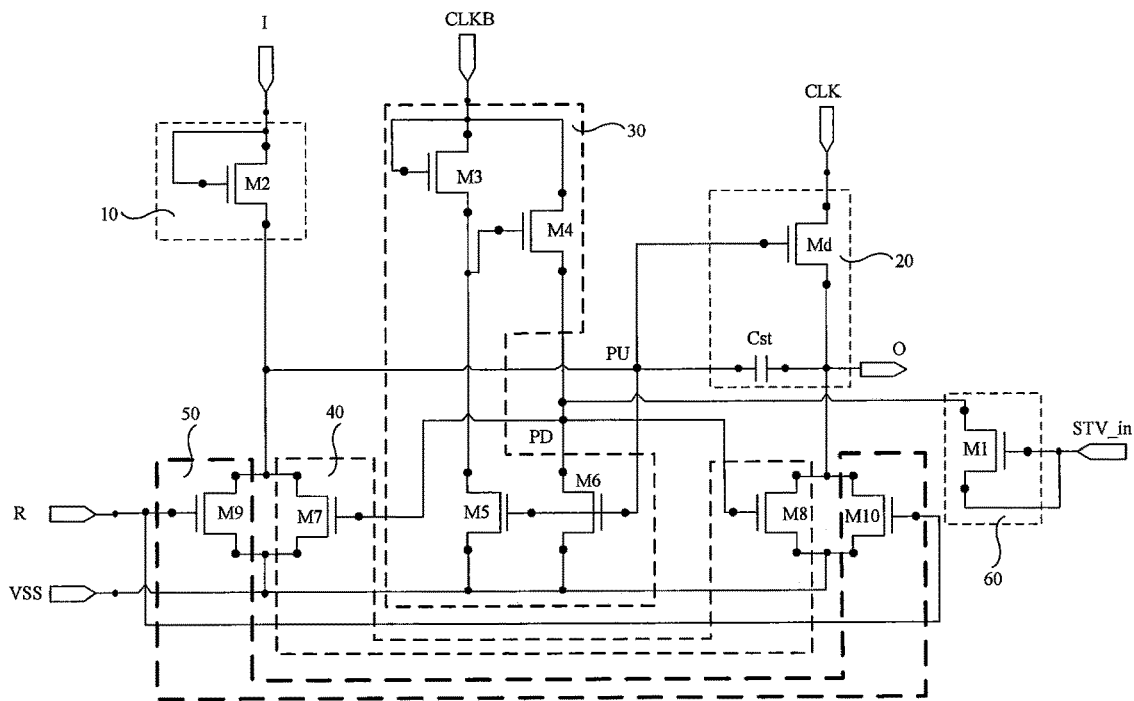
FIG. 2 is a specific structure diagram corresponding to the various modules in FIG. 1.

Exemplarily, as shown in FIG. 2, the noise reduction control circuit 60 is constituted by a first transistor M1. The gate and a first pole of the first transistor M1 are connected with the noise reduction control signal terminal STV_in, and a second pole thereof is connected with the pull-down node PD.

The pull-up control circuit 10 includes a second transistor M2.

Therein, the gate and a first pole of the second transistor M2 are connected with the signal input terminal I, and a second pole thereof is connected with the pull-up node PU.

Figure 3:
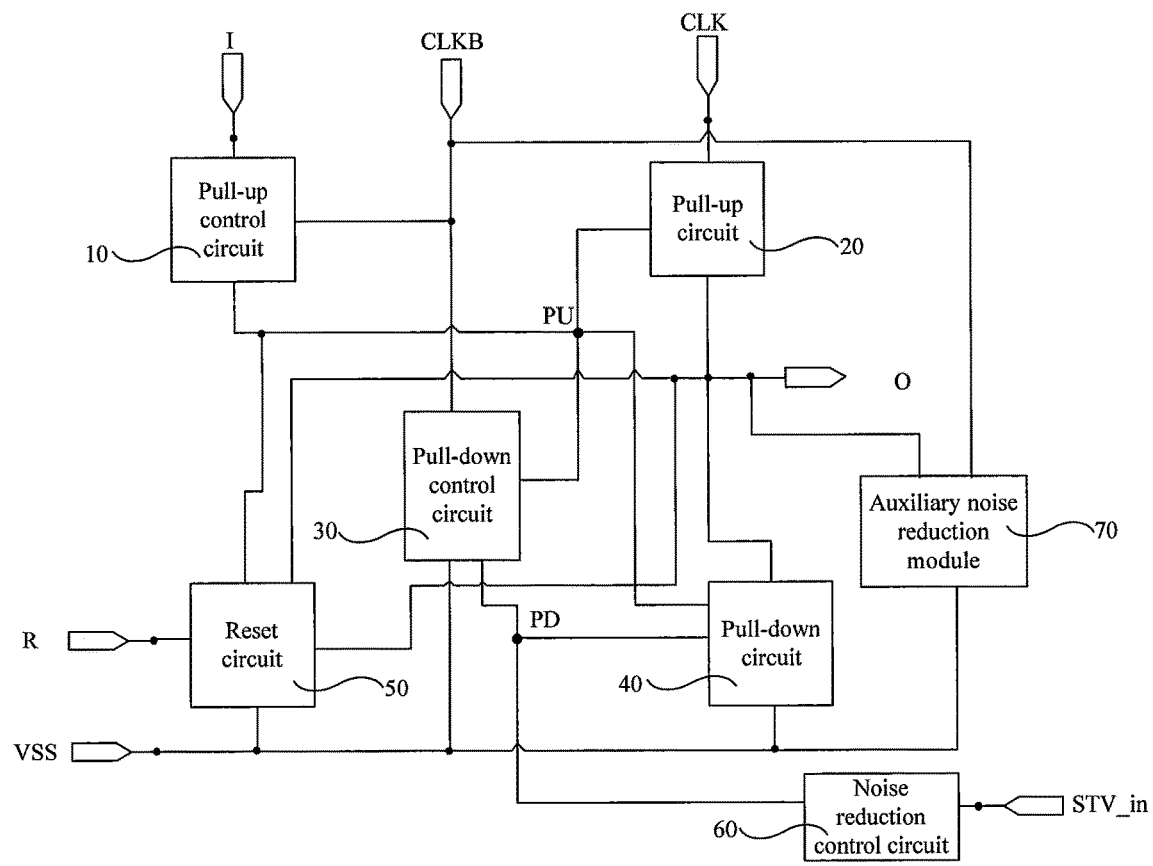
FIG. 3 is a structure diagram of another shift register provided by an embodiment of the disclosure.

Based on this, as shown in FIG. 3, when the pull-up control circuit 40 is further connected with the second clock signal input terminal CLKB, the pull-up control circuit 40 is further used for outputting the voltage of the signal input terminal I to the pull-up node PU under the control of the second clock signal input terminal CLKB.

Figure 4:
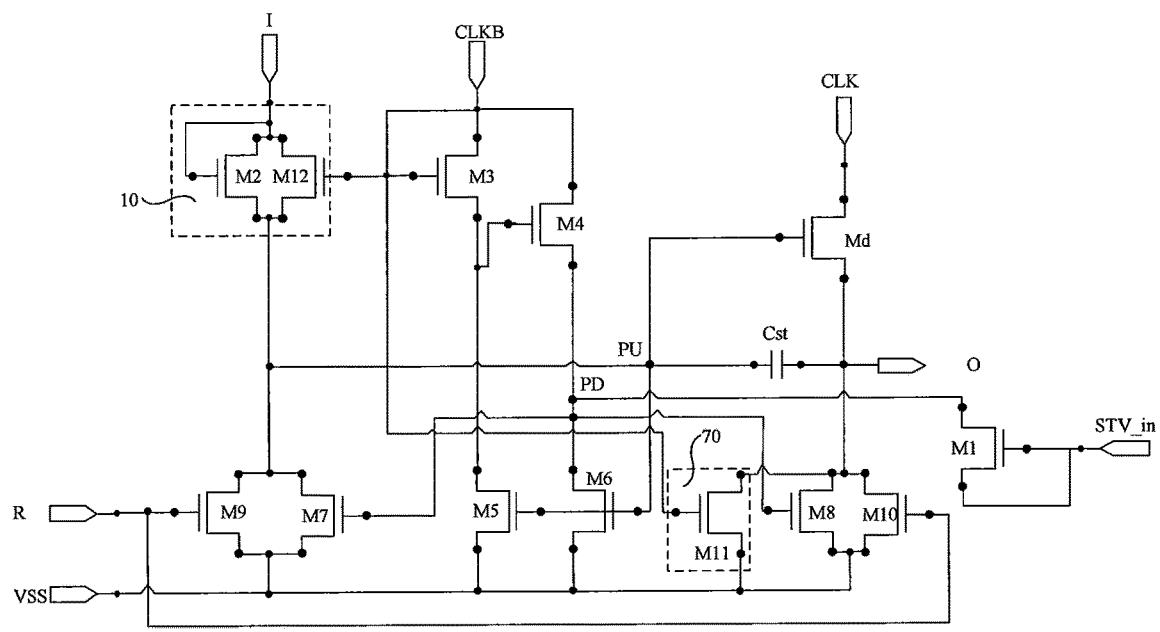
FIG. 4 is a specific structure diagram corresponding to the various modules in FIG. 3.

In such a case, the pull-up control circuit 40 further includes a twelfth transistor M12, as shown in FIG. 4. Therein, the gate of the twelfth transistor M12 is connected with the second clock signal input terminal CLKB, a first pole thereof is connected with the signal input terminal I, and a second pole thereof is connected with the pull-up node PU.

As can be seen from the above, when both the second transistor M2 and the twelfth transistor M12 are conductive, the two transistors each output the signal of the signal input terminal I to the pull-up node PU, and therefore, the second transistor M2 and the twelfth transistor M12 have the same function. As such, when one of the transistors is damaged, the pull-up control circuit 40 may still work normally.

Based on this, as shown in FIG. 2, the pull-up circuit includes a driving transistor Md and a storage capacitor Cst.

Therein, the gate of the driving transistor Md is connected with the pull-up node PU, a first pole thereof is connected with the first clock signal input terminal CLK, and a second pole thereof is connected with the signal output terminal O.

It needs to be noted that, since the driving transistor Md is connected with the signal output terminal O, and in turn the signal output terminal O is connected with a gate line in an array substrate, the driving transistor Md is connected with a load and it needs to have a certain driving ability. In such a case, as compared to other transistors which only function as a switch, the size of the driving transistor Md is relatively large.

Additionally, one end of the storage capacitor Cst is connected with the pull-up node PU, and the other end is connected with the signal output terminal O. The storage capacitor Cst may store the voltage inputted to the pull-up node PU, and may also release the stored voltage to the gate of the driving transistor Md.

Further, the pull-down control circuit 30 includes a third transistor M3, a fourth transistor M4, a fifth transistor M5 and a sixth transistor M6.

Therein, the gate and a first pole of the third transistor M3 are connected with the second clock signal input terminal CLKB, and a second pole thereof is connected with the gate of the fourth transistor M4.

The first pole of the fourth transistor M4 is connected with the second clock signal input terminal CLKB, and a second pole thereof is connected with the pull-down node PD.

The gate of the fifth transistor M5 is connected with the pull-up node PU, a first pole thereof is connected with the second pole of the third transistor M3, and a second pole thereof is connected with the first voltage terminal VSS.

The gate of the sixth transistor M6 is connected with the pull-up node PU, a first pole thereof is connected with the pull-down node PD, and a second pole thereof is connected with the first voltage terminal VSS.

In addition, the pull-down circuit 40 includes a seventh transistor M7 and an eighth transistor M8.

Therein, the gate of the seventh transistor M7 is connected with the pull-down node PD, a first pole thereof is connected with the pull-up node PU, and a second pole thereof is connected with the first voltage terminal VSS.

The gate of the eighth transistor M8 is connected with the pull-down node PD, a first pole thereof is connected with the signal output terminal O, and a second pole thereof is connected with the first voltage terminal VSS.

The reset circuit 50 includes a ninth transistor M9 and a tenth transistor M10.

Therein, the gate of the ninth transistor M9 is connected with the reset signal terminal R, a first pole thereof is connected with the pull-up node PU, and a second pole thereof is connected with the first voltage terminal VSS.

The gate of the tenth transistor M10 is connected with the reset signal terminal R, a first pole thereof is connected with the signal output terminal O, and a second pole thereof is connected with the first voltage terminal VSS.

On this basis, exemplarily, the shift register further includes an auxiliary noise reduction module 70 as shown in FIG. 3, to further improve the noise reduction effect on the shift register.

Exemplarily, the auxiliary noise reduction module 70 is connected with the second clock signal input terminal CLKB, the signal output terminal O and the first voltage terminal VSS. The auxiliary noise reduction module 70 is used for pulling down the voltage of the signal output terminal O to the voltage of the first voltage terminal VSS under the control of the second clock signal input terminal CLKB.

Based on this, the auxiliary noise reduction module 70 may include an eleventh transistor M11, as shown in FIG. 4.

Therein, the gate of the eleventh transistor M11 is connected with the second clock signal input terminal CLKB, a first pole thereof is connected with the signal output terminal O, and a second pole thereof is connected with the first voltage terminal VSS.

It needs to be noted that, the above mentioned transistors may be N-type transistors, and in such a case, the first pole of a transistor may be the drain, and the second pole may be the source. Or, the above mentioned transistors may also be P-type transistors, and in such a case, the first pole of a transistor may be the source, and the second pole is the drain. In addition, the above mentioned transistors may be enhanced transistors, or also may be depleted transistors, which will not be defined by the disclosure.

In the following, a detailed illustration will be given for the ON/OFF conditions of the individual transistors in the shift register as shown in FIG. 4 at different phases (P1~P3 and the blanking time) of an image frame, taking that the above mentioned transistors and various transistors connected with a gate line and located in a sub-pixel are all N-type transistors as an example, and in connection with FIG. 5. Therein, in the embodiments of the disclosure, the illustration is given taking that the first voltage terminal VSS constantly outputs a low level as an example.

At an input phase P1, STY_in=0, CLK=0, CLKB=1, I=1, R=0, O=0, wherein "0" means a low level, and "1" means a high level.

In this case, the signal input terminal I outputs a high level, the second transistor M2 is conductive, the second clock signal input terminal CLKB outputs a high level, and the twelfth transistor M12 is conductive, such that the high level of the signal input terminal I can be transmitted to the pull-up node PU via the second transistor M2 and the twelfth transistor M12, thereby charging the pull-up node PU and causing the potential of the pull-up node PU to rise.

At this point, the storage capacitor Cst stores the voltage inputted to the pull-up node PU. In addition, as the potential of the pull-up node PU rises gradually, the driving transistor Md is conductive, and thereby transmits the low level outputted by the first clock signal input terminal CLK to the signal output terminal O.

In addition, under the control of the high potential of the pull-up node PU, the fifth transistor M5 and the sixth transistor M6 are conductive. Therefore, even if the high level outputted by the second clock signal input terminal CLKB would switch on the third transistor M3, the conductive fifth transistor M5 will pull down the potentials of the second pole of the third transistor M3 and the gate of the fourth transistor M4 to the first voltage terminal VSS, which may thus avoid that the fourth transistor M4 is conductive, such that the high level of the second clock signal input terminal CLKB cannot be outputted to the pull-down node PD via the fourth transistor M4, and at this point, the pull-down node PD is at a low level.

Based on this, since the sixth transistor M6 is conductive, the potential of the pull-down node PD may be pulled down to the first voltage terminal VSS. In such a case, both the seventh transistor M7 and the eighth transistor M8 are in a cut-off state. In addition, since the reset signal terminal R outputs a low level, both the ninth transistor M9 and the tenth transistor M10 are in the cut-off state.

From the above, the signal output terminal O outputs a low level at the input phase P1, and therefore, at this phase, the shift register is at a non-output phase and does not output a gate driving signal.

At an output phase P2, STV_in=0, CLK=1, CLKB=0, I=0, R=0, O=1.

In such a case, the signal input terminal I outputs a low level, the second transistor M2 is in the cut-off state, the second clock signal input terminal CLKB inputs a low level, the twelfth transistor M12, the third transistor M3 and the fourth transistor M4 are in the cut-off state.

In addition, the storage capacitor Cst releases the high level stored at the input phase P1, to charge the pull-up node PU, such that the driving transistor Md keeps in a turn-on state. In this case, the high level of the first clock signal input terminal CLK is outputted to the signal output terminal O via the driving transistor Md. On this basis, under the bootstrapping effect of the storage capacitor Cst, the potential of the pull-up node PU further rises to maintain the state in which the driving transistor Md is conductive, such that the high level of the first clock signal input terminal CLK can be continuously and stably outputted to a gate line connected with the signal output terminal O as a gate scanning signal.

Additionally, under the control of the high potential of the pull-up node PU, the fifth transistor M5 and the sixth transistor M6 are conductive. The sixth transistor M6 pulls down the potential of the pull-down node PD to the low level of the first voltage terminal VGL. In this case, as at the input phase P1, the seventh transistor M7 and the eighth transistor M8 are in the cut-off state. The reset signal terminal R outputs a low level, and both the ninth transistor M9 and the tenth transistor M10 are in the cut-off state.

From the above, the signal output terminal O outputs a high level at the output phase P2, and the high level is outputted to a gate line(s) connected with the signal output terminal O as a gate scanning signal, to gate sub-pixels controlled by the row of gate lines.

At a reset phase P3, STV_in=0, CLK=0, CLKB=1, I=0, R=1, O=0.

In such a case, the reset signal terminal R outputs a high level, the ninth transistor M9 and the tenth transistor M10 are conductive, the potential of the pull-up node PU is pulled down to the first voltage terminal VSS via the ninth transistor M9 to reset the pull-up node PU, and the potential of the signal output terminal O is pulled down to the first voltage terminal VSS via the tenth transistor M10 to reset the signal output terminal O.

In addition, the second clock signal input terminal CLKB outputs a high level to cause the third transistor M3 to be conductive, the high level outputted by the second clock signal input terminal CLKB is transmitted to the gate of the fourth transistor M4 via the third transistor M3, and the fourth transistor M4 is conductive, such that the high level outputted by the second clock signal input terminal CLKB is transmitted to the pull-down node PD via the fourth transistor M4, and the pull-down node PD is at a high level.

Under the control of the pull-down node PD, the seventh transistor M7 and the eighth transistor M8 are conductive, the potential of the pull-up node PU is pulled down to the first voltage terminal VSS via the seventh transistor M7, and the potential of the signal output terminal O is pulled down to the first voltage terminal VSS via the eighth transistor M8.

In addition, since the potential of the pull-up node PU is pulled low, the driving transistor Md, the fifth transistor M5 and the sixth transistor M6 are cut off.

From the above, the signal output terminal O outputs a low level at the reset phase P3, and therefore, at this phase, the shift register is at a non-output phase and does not output a gate driving signal.

In the blanking time, STV_in=1, I=0, R=0, O=0.

In such a case, under the control of the high level outputted by the noise reduction control signal terminal STV_in, the first transistor M1 is conductive, and thereby transmits the high level outputted by the noise reduction control signal terminal STV_in to the pull-down node PD via the first transistor M1. As such, in the blanking time, the pull-down node PD can continuously keep at a high level. In this case, under the control of the pull-down node PD, the seventh transistor M7 and the eighth transistor M8 are conductive, the potential of the pull-up node PU is continuously pulled down to the first voltage terminal VSS via the seventh transistor M7, and thereby it may be possible to continuously perform noise reduction on the pull-up node PU in the blanking time, and the potential of the signal output terminal O is continuously pulled down to the first voltage terminal VSS via the eighth transistor M8, and thereby it may be possible to continuously perform noise reduction on the signal output terminal O in the blanking time. Thus, influence of noise on the display effect may be avoided effectively.

It needs to be noted that, the ON/OFF processes of the transistors in the above embodiment are described taking that all the transistors are N-type transistors. When all the transistors are P-type transistors, it is necessary to flip part of the control signals in FIG. 5, and the ON/OFF processes of the transistors of the various modules in the shift register are the same as described above, which will not be repeated here any longer.

Figure 6:
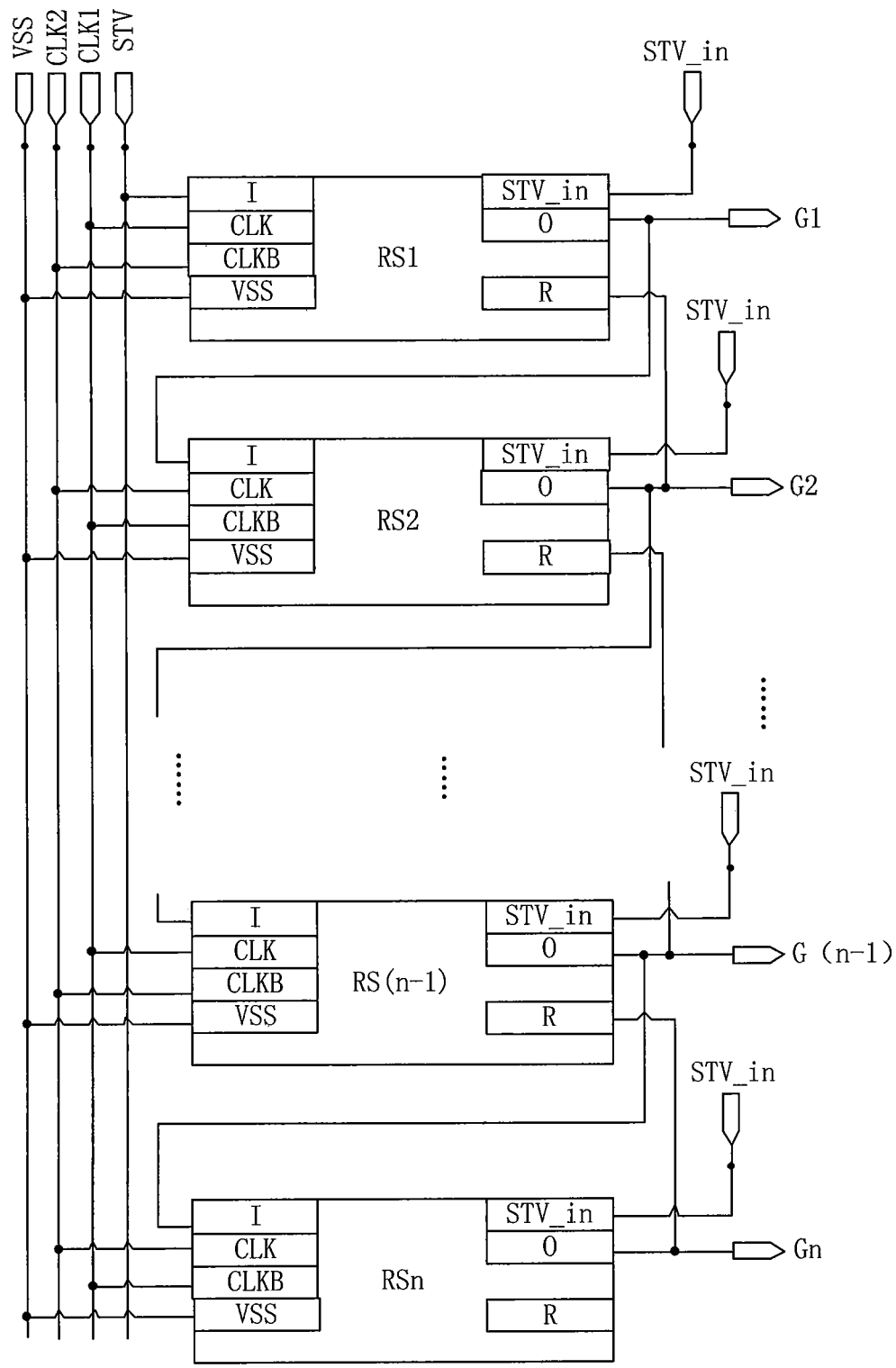
FIG. 6 is a structure diagram of a gate driving circuit provided by an embodiment of the disclosure.

An embodiment of the disclosure provides a gate driving circuit which, as shown in FIG. 6, includes multiple cascaded shift registers (RS1, RS2, . . . , RSn) of any of the kinds as described above, wherein n≥2, and n is a positive integer.

The signal input terminal I of the shift register RS1 at a first stage is connected with a starting signal terminal STV. Apart from the shift register RS1 at the first stage, the signal output terminal I of the shift register at a previous stage is connected with the signal input terminal I of the shift register at a next stage.

As can be seen from the above, apart from the shift register RS1 at the first stage, the signal input terminal I of a remaining shift register is connected with the signal output terminal O of the shift register at a previous stage. Based on this, when the pull-up control circuit 10 of the remaining shift register further includes the twelfth transistor M12 as shown in FIG. 4, under the control of the second clock signal input terminal CLKB, the noise of the signal output terminal O of the shift register at the previous stage may be transmitted to the pull-up node PU in the shift register at the next stage via the twelfth transistor M12, and then noise reduction is performed on the pull-up node PU by the reset circuit 50, the pull-down circuit 40 and the noise reduction control circuit 60 in the shift register at this stage, so as to achieve the purpose of noise reduction stage by stage.

It needs to be noted that, the starting signal terminal STV is used for outputting a starting signal, and after the signal input terminal I of the shift register RS1 at the first stage of the gate driving circuit receives the starting signal, the multiple cascaded shift registers scan the gate lines (G1, G2, ..., Gn) connected with their respective signal output terminals O row by row.

In addition, apart from the shift register RSn at a last stage, the signal output terminal O of the shift register at a next stage is connected with the reset signal terminal R of the shift register at a previous stage. The reset signal terminal R of the shift register RSn at the last stage may be connected with the starting signal terminal STV. As such, when the starting signal of the starting signal terminal STV is inputted to the signal input terminal I of the shift register RS1 at the first stage, the reset signal terminal R of the shift register RSn at the last stage may take the starting signal of the starting signal terminal STV as a reset signal to reset the signal output terminal O and the pull-up node PU of the shift register RSn at the last stage.

Based on this, the noise reduction control signal terminal STV_in connected with each of the shift registers is separately arranged as shown in FIG. 6.

Figure 5:
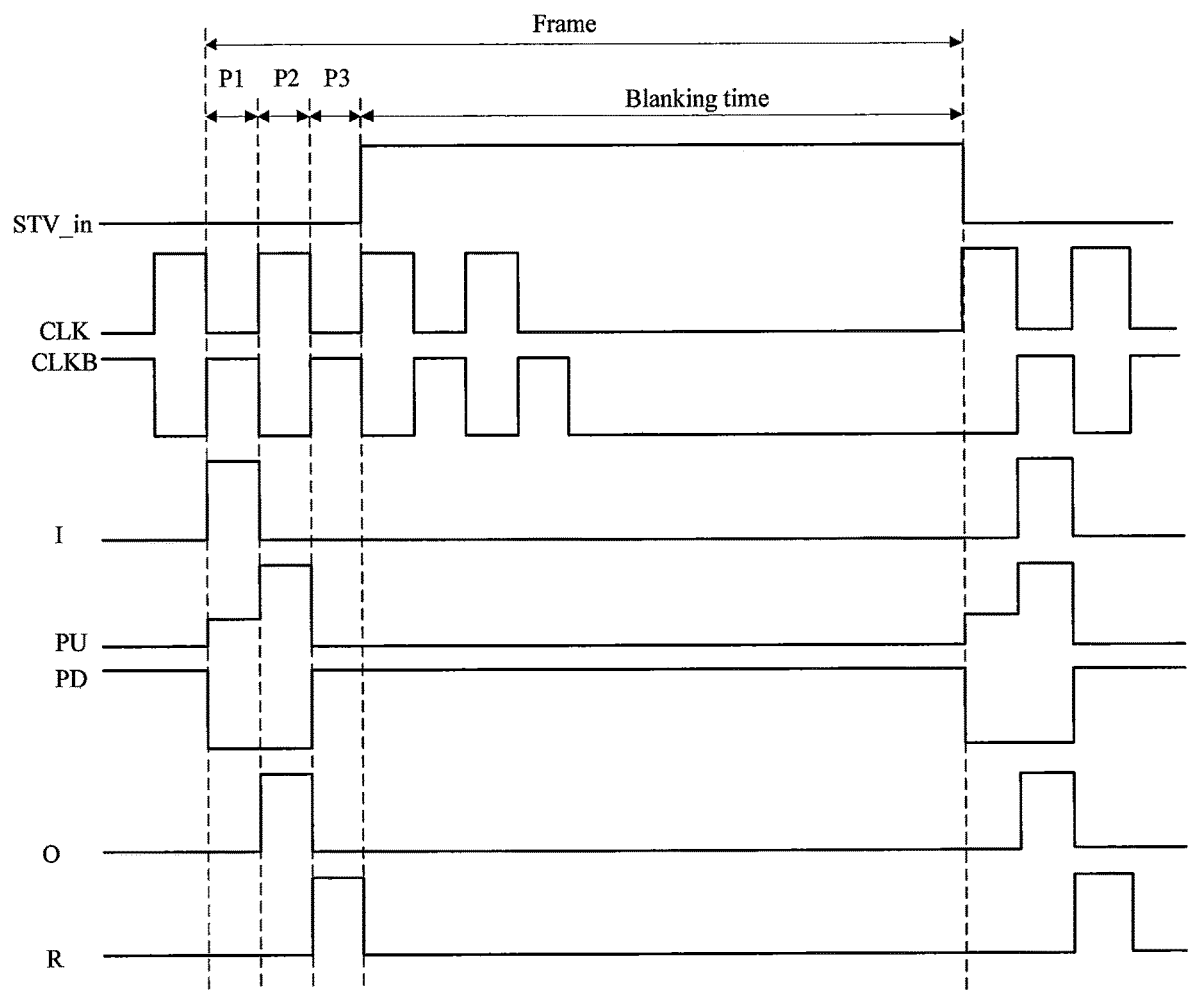
FIG. 5 is a timing diagram of the individual control signals for driving the shift register as shown in FIG. 2 or FIG. 4.

It needs to be noted that, in order to cause that for the signals outputted by the first clock signal input terminal CLK and the second clock signal input terminal CLKB of each of the shift registers, the frequencies and the amplitudes of their waveforms are the same and the phases thereof are opposite as shown in FIG. 5, it may be such that, as shown in FIG. 6, the first clock signal input terminals CLK and the second clock signal input terminals CLKB on different shift registers are alternately connected with a first system clock signal input terminal CLK1 and a second system clock signal input terminal CLK2, respectively.

For example, the first clock signal input terminal CLK of the shift register RS1 at the first stage is connected with the first system clock signal input terminal CLK1, and the second clock signal input terminal CLKB thereof is connected with the second system clock signal input terminal CLK2, and the first clock signal input terminal CLK of the shift register RS2 at the second stage is connected with the second system clock signal input terminal CLK2, and the second clock signal input terminal CLKB thereof is connected with the first system clock signal input terminal CLK3. The connection mode of the subsequent shift registers is the same as described above.

An embodiment of the disclosure provides a display device including a gate driving circuit as described above. The gate driving circuit of the display device has the same structure and beneficial effects as that provided by the above embodiment. Since the above embodiment has already described the structure and beneficial effects of the gate driving circuit in detail, these will not be repeated here any longer.

An embodiment of the disclosure provides a method for driving a shift register of any of the kinds as described above, and in an image frame, the method includes the following.

At an input phase P1 as shown in FIG. 5, the pull-up control circuit 10 as shown in FIG. 1 or FIG. 3 outputting the voltage of the signal input terminal I to the pull-up node PU under the control of the signal input terminal I, the pull-up circuit 20 storing the potential of the pull-up node PU and outputting the voltage of the first clock signal input terminal CLK to the signal output terminal O under the control of the pull-up node PU, and the pull-down control circuit 30 pulling down the voltage of the pull-down node PD to the voltage of the first voltage terminal VSS under the control of the pull-up node.

At an output phase P2, the pull-up circuit 20 outputting the signal stored at the previous phase to the pull-up node PU, the pull-up circuit 20 outputting the voltage of the first clock signal input terminal CLK to the signal output terminal O under the control of the pull-up node PU, such that the signal output terminal O outputs a gate scanning signal.

In addition, the pull-down control circuit 30 pulling down the voltage of the pull-down node PU to the voltage of the first voltage terminal VSS under the control of the pull-up node PU.

At a reset phase P3, the reset circuit 50 pulling down the voltages of the pull-up node PU and the signal output terminal O to the voltage of the first voltage terminal VSS, respectively, under the control of the reset signal terminal R, the pull-down control circuit 30 outputting the voltage of the second clock signal input terminal CLKB to the pull-down node PD under the control of the second clock signal input terminal CLKB.

In this case, the pull-down circuit 40 pulling down the voltages of the pull-up node PU and the signal output terminal O to the voltage of the first voltage terminal VSS, respectively, under the control of the pull-down node PD.

In the blanking time, the noise reduction control circuit 60 outputting the voltage of the noise reduction control signal terminal STV_in to the pull-down node PD under the control of the noise reduction control signal terminal STV_in, and the pull-down circuit 40 pulling down the voltages of the pull-up node PU and the signal output terminal O to the voltage of the first voltage terminal VSS, respectively, under the control of the pull-down node PD.

Exemplarily, when the structures of the individual modules in the shift register are as shown in FIG. 2 or FIG. 4, and the transistors in the individual modules are N-type transistors, the ON/OFF states of the transistors in the individual modules at the above described various phases are the same as described above, and will not be repeated here any longer.

On this basis, as shown in FIG. 3, in a case in which the shift register includes the auxiliary noise reduction module 70, in an image frame, the method further includes:

at the input phase P1 and the reset phase P3, the auxiliary noise reduction module 70 pulling down the voltage of the signal output terminal O to the voltage of the first voltage terminal VSS under the control of the second clock signal input terminal CLKB.

Exemplarily, when the structure of the auxiliary noise reduction module 70 includes an eleventh transistor M11 as shown in FIG. 4, and the eleventh transistor M11 is an N-type transistor, the eleventh transistor M11 may be in a conductive state when the second clock signal input terminal CLKB outputs a high level, and thereby pull down the voltage of the signal output terminal O to the voltage of the first voltage terminal VSS.

It may be appreciated by the person having ordinary skills in the art that all or part of the steps of the above method embodiment may be accomplished by program instruction related hardware, the program may be stored in a computer readable storage medium, and the program performs the steps of the above method embodiment when executed, and the storage medium mentioned above comprises: various media which may store a program code, such as ROM, RAM, a magnetic disk or a compact disc, etc.

What are described above are just specific embodiments of the disclosure, however, the protection scope of the disclosure is not limited thereto, and variations or alternatives easily occurring to any artisan familiar with the technical field within the technical scope disclosed by the disclosure should be encompassed within the protection scope of the disclosure. Therefore, the protection scope of the disclosure should be subject to the protection scope of the claims.

The invention claimed is:

1. A shift register comprising:
a pull-up control circuit;
a pull-up circuit;
a pull-down control circuit;
a pull-down circuit;
a reset circuit; and
a noise reduction control circuit,
wherein the pull-up control circuit is connected between a signal input terminal and a pull-up node, and is configured to output a voltage of the signal input terminal to the pull-up node based on the signal input terminal,
wherein the pull-up circuit is connected to the pull-up node, a first clock signal input terminal and a signal output terminal, and is configured to store a potential of the pull-up node and is configured to output a voltage of the first clock signal input terminal to the signal output terminal based on the pull-up node,
wherein the pull-down control circuit is connected to a second clock signal input terminal, the pull-up node, a pull-down node and a first voltage terminal, and is configured to output a voltage of the second clock signal input terminal to the pull-down node based on the second clock signal input terminal, or configured to pull down a voltage of the pull-down node to a voltage of the first voltage terminal based on the pull-up node,
wherein the pull-down circuit is connected to the pull-down node, the pull-up node, the signal output terminal and the first voltage terminal, and is configured to pull down a voltage of the pull-up node and a voltage of the signal output terminal to the voltage of the first voltage terminal based on the pull-down node,
wherein the reset circuit is connected to a reset signal terminal, the pull-up node, the signal output terminal and the first voltage terminal, and is configured to pull down the voltage of the pull-up node and the voltage of the signal output terminal to the voltage of the first voltage terminal based on the reset signal terminal, and the reset circuit comprises a first transistor and a second transistor, a gate of the first transistor is connected to the reset signal terminal, a first pole of the first transistor is connected to the pull-up node, a second pole of the first transistor is connected to the first voltage terminal, and a gate of the second transistor is connected to the reset signal terminal, a first pole of the second transistor is connected to the signal output terminal, and a second pole of the second transistor is connected to the first voltage terminal,
wherein the noise reduction control circuit is connected to a noise reduction control signal terminal and the pull-down node, and is configured to output a voltage of the noise reduction control signal terminal to the pull-down node based on the noise reduction control signal terminal in a blanking time of an image frame, and the noise reduction control circuit comprises a third transistor, a gate and a first pole of the third transistor are connected to the noise reduction control signal terminal, and a second pole of the third transistor is connected to the pull-down node, and
wherein the noise reduction control circuit is configured to, when the reset circuit makes the first transistor and the second transistor change from a conductive state to a cut-off state, make the third transistor change from a cut-off state to a conductive state.

2. The shift register of claim 1, wherein the pull-up control circuit comprises a fourth transistor, and
wherein a gate and a first pole of the fourth transistor are connected to the signal input terminal, and a second pole of the fourth transistor is connected to the pull-up node.

3. The shift register of claim 2, wherein the pull-up control circuit is further connected to the second clock signal input terminal, and is configured to output the voltage of the signal input terminal to the pull-up node based on the second clock signal input terminal,
wherein the pull-up control circuit further comprises a twelfth transistor,
wherein the gate of the twelfth transistor is connected to the second clock signal input terminal, a first pole of the twelfth transistor is connected to the signal input terminal, and a second pole of the twelfth transistor is connected to the pull-up node.

4. The shift register of claim 1, wherein the pull-up circuit comprises a driving transistor and a storage capacitor,
wherein a gate of the driving transistor is connected to the pull-up node, a first pole of the driving transistor is connected to the first clock signal input terminal, and a second pole of the driving transistor is connected to the signal output terminal, and
wherein a first end of the storage capacitor is connected to the pull-up node, and a second end of the storage capacitor is connected to the signal output terminal.

5. The shift register of claim 1, wherein the pull-down control circuit comprises a fifth transistor, a sixth transistor, a seventh transistor and an eighth transistor,
wherein a gate and a first pole of the fifth transistor are connected to the second clock signal input terminal, and a second pole of the fifth transistor is connected to a gate of the sixth transistor,
wherein a first pole of the sixth transistor is connected to the second clock signal input terminal, and a second pole of the sixth transistor is connected to the pull-down node,
wherein a gate of the seventh transistor is connected to the pull-up node, a first pole of the seventh transistor is connected to the second pole of the fifth transistor, and a second pole of the seventh transistor is connected to the first voltage terminal, and
wherein a gate of the eighth transistor is connected to the pull-up node, a first pole of the eighth transistor is connected to the pull-down node, and a second pole of the eighth transistor is connected to the first voltage terminal.

6. The shift register of claim 1, wherein the pull-down circuit comprises a ninth transistor and a tenth transistor,
wherein a gate of the ninth transistor is connected to the pull-down node, a first pole of the ninth transistor is connected to the pull-up node, and a second pole of the ninth transistor is connected to the first voltage terminal, and
wherein a gate of the tenth transistor is connected to the pull-down node, a first pole of the tenth transistor is connected to the signal output terminal, and a second pole of the tenth transistor is connected to the first voltage terminal.

7. The shift register of claim 1, further comprising:
an auxiliary noise reduction module which is connected to the second clock signal input terminal, the signal output terminal and the first voltage terminal, wherein the auxiliary noise reduction module is configured to pull down the voltage of the signal output terminal to the voltage of the first voltage terminal based on the second clock signal input terminal.

8. The shift register of claim 7, wherein the auxiliary noise reduction module comprises an eleventh transistor, and
wherein a gate of the eleventh transistor is connected to the second clock signal input terminal, a first pole of the eleventh transistor is connected to the signal output terminal, and a second pole of the eleventh transistor is connected to the first voltage terminal.

9. A gate driving circuit comprising a plurality of cascaded shift registers, wherein at least one of the plurality of cascaded shift registers is configured as the shift register of claim 1,
wherein the signal input terminal of the shift register at a first stage of the plurality of cascaded shift registers is connected to a starting signal terminal,
wherein excluding a shift register at a first stage of the plurality of cascaded shift registers, a signal output terminal of a shift register at a previous stage of the plurality of cascaded shift registers is connected to a signal input terminal of the shift register at a next stage of the plurality of cascaded shift registers,
wherein excluding a shift register at a last stage of the plurality of cascaded shift registers, a signal output terminal of the shift register at the next stage of the plurality of cascaded shift registers is connected to a reset signal terminal of the shift register at the previous stage of the plurality of cascaded shift registers, and
wherein a reset signal terminal of the shift register at the last stage of the plurality of cascaded shift registers is connected to the starting signal terminal.

10. A display device, comprising the gate driving circuit of claim 9.

11. The gate driving circuit of claim 9,
wherein the pull-up control circuit comprises a fourth transistor, and
wherein a gate and a first pole of the fourth transistor are connected to the signal input terminal, and a second pole of the fourth transistor is connected to the pull-up node.

12. The gate driving circuit of claim 9,
wherein the pull-up circuit comprises a driving transistor and a storage capacitor,
wherein a gate of the driving transistor is connected to the pull-up node, a first pole of the driving transistor is connected to the first clock signal input terminal, and a second pole of the driving transistor is connected to the signal output terminal, and
wherein a first end of the storage capacitor is connected to the pull-up node, and a second end of the storage capacitor is connected to the signal output terminal.

13. The gate driving circuit of claim 9,
wherein the pull-down control circuit comprises a fifth transistor, a sixth transistor, a seventh transistor and an eighth transistor,
wherein a gate and a first pole of the fifth transistor are connected to the second clock signal input terminal, and a second pole of the fifth transistor is connected to a gate of the sixth transistor,
wherein a first pole of the sixth transistor is connected to the second clock signal input terminal, and a second pole of the sixth transistor is connected to the pull-down node,
wherein a gate of the seventh transistor is connected to the pull-up node, a first pole of the seventh transistor is connected to the second pole of the fifth transistor, and a second pole of the seventh transistor is connected to the first voltage terminal, and
wherein a gate of the eighth transistor is connected to the pull-up node, a first pole of the eighth transistor is connected to the pull-down node, and a second pole of the eighth transistor is connected to the first voltage terminal.

14. The gate driving circuit of claim 9,
wherein the pull-down circuit comprises a ninth transistor and an tenth transistor,
wherein a gate of the ninth transistor is connected to the pull-down node, a first pole of the ninth transistor is connected to the pull-up node, and a second pole of the ninth transistor is connected to the first voltage terminal, and
wherein a gate of the tenth transistor is connected to the pull-down node, a first pole of the tenth transistor is connected to the signal output terminal, and a second pole of the tenth transistor is connected to the first voltage terminal.

15. A method for driving the shift register of claim 1, for an image frame, the method comprising:
at an input phase, the method comprising:
outputting, by the pull-up control circuit, the voltage of the signal input terminal to the pull-up node based on the signal input terminal;
storing, by the pull-up circuit, the potential of the pull-up node;
outputting the voltage of the first clock signal input terminal to the signal output terminal based on the pull-up node, and
pulling down the voltage of the pull-down node to the voltage of the first voltage terminal based on the pull-up node, by the pull-down control circuit;
at an output phase, the method comprising:
outputting, by the pull-up circuit, a signal stored at a previous phase to the pull-up node,
outputting, by the pull-up circuit, the voltage of the first clock signal input terminal to the signal output terminal based on the pull-up node,
outputting, by the signal output terminal, a gate scanning signal, and
pulling down the voltage of the pull-down node to the voltage of the first voltage terminal, by the pull-down control circuit, based on the pull-up node;
at a reset phase, the method comprising:
pulling down, by the reset circuit, the voltage of the pull-up node and the voltage of the signal output terminal to the voltage of the first voltage terminal, based on the reset signal terminal,
outputting the voltage of the second clock signal input terminal to the pull-down node, by the pull-down control circuit, based on the second clock signal input terminal, and
pulling down the voltage of the pull-up node and the voltage of the signal output terminal to the voltage of the first voltage terminal, by the pull-down circuit, based on the pull-down node; and
in the blanking time, the method comprising:
outputting, by the noise reduction control circuit, the voltage of the noise reduction control signal terminal to the pull-down node based on the noise reduction control signal terminal, and
pulling down the voltage of the pull-up node and the voltage of the signal output terminal to the voltage of the first voltage terminal, by the pull-down circuit, based on the pull-down node.

16. The method of claim 15, wherein the shift register comprises a auxiliary noise reduction module, the method further comprising:
pulling down the voltage of the signal output terminal to the voltage of the first voltage terminal during the input phase and/or during the reset phase, by the auxiliary noise reduction module based on the second clock signal input terminal.

* * * * *